(12) United States Patent
Higuchi (10) Patent No.: US 7,760,059 B2
(45) Date of Patent: Jul. 20, 2010

(54) PERMANENT MAGNET TYPE MAGNETIC FIELD GENERATING APPARATUS

(75) Inventor: Dai Higuchi, Takefu (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 16 days.

(21) Appl. No.: 11/038,857

(22) Filed: Jan. 20, 2005

(65) Prior Publication Data

US 2005/0162250 A1    Jul. 28, 2005

(30) Foreign Application Priority Data

Jan. 22, 2004    (JP)    ............... 2004-013746

(51) Int. Cl.
*H01F 7/02*    (2006.01)
(52) U.S. Cl. .................................... 335/306
(58) Field of Classification Search ......... 335/296–306; 324/318–320
See application file for complete search history.

(56) References Cited

U.S. PATENT DOCUMENTS

| | | | |
|---|---|---|---|
| 4,862,128 A * | 8/1989 | Leupold | 335/306 |
| H0693 H * | 10/1989 | Leupold | 335/306 |
| 5,055,812 A * | 10/1991 | Abele et al. | 335/210 |
| 5,148,138 A * | 9/1992 | Miyata | 335/302 |
| 5,523,732 A * | 6/1996 | Leupold | 335/306 |
| 5,658,396 A | 8/1997 | Sakurada et al. | |
| 5,659,250 A * | 8/1997 | Domigan et al. | 324/320 |
| 5,750,044 A | 5/1998 | Yoneyama et al. | |
| 6,290,782 B1 | 9/2001 | Sakurada et al. | |
| 6,436,230 B1 | 8/2002 | Kondo et al. | |
| 6,764,575 B1 * | 7/2004 | Yamasaki et al. | 156/345.46 |
| 2002/0011279 A1 | 1/2002 | Sakurada et al. | |

FOREIGN PATENT DOCUMENTS

| | | |
|---|---|---|
| DE | 42 27 503 | 2/1994 |
| EP | 1 383 143 | 1/2004 |
| JP | 62-126603 | 6/1987 |
| JP | 03 082447 | 4/1991 |
| JP | 03-257159 | 11/1991 |
| JP | 04-022336 | 1/1992 |
| JP | 04 146605 | 5/1992 |

(Continued)

OTHER PUBLICATIONS

European Search Report for 05251040.1 dated Jul. 15, 2005.

(Continued)

*Primary Examiner*—Ramon M Barrera
(74) *Attorney, Agent, or Firm*—Alston & Bird LLP (57) ABSTRACT

It is an object of the present invention to achieve a magnetic field with high uniformity and low skew angle in a dipole ring magnetic field generating apparatus. There is provided a permanent magnet type magnetic field generating apparatus comprising: a plurality of permanent magnet pieces disposed in a ring shape so that a substantially unidirectional magnetic field is generated in a space within the ring, the permanent magnet pieces having the magnetization direction undergoing one rotation over a half-circumference of the ring, the permanent magnet pieces having substantially the same magnetic strength, and the permanent magnet pieces being disposed so as to form indentations and protrusions toward a center axis of the ring, or having a shape having indentations and protrusions facing the center axis.

16 Claims, 4 Drawing Sheets

FOREIGN PATENT DOCUMENTS

| | | |
|---|---|---|
| JP | 5-143972 | 6/1993 |
| JP | 11 087119 | 3/1999 |

OTHER PUBLICATIONS

Lectard et al., "Saturation Magnetization and Anistropy Fields in the $SM(Co_{1-x}Cu_x)_5$ Phases," *J. Applied Physics*, vol. 75, No. 10, pp. 6277-6279, May 15, 1994.

Xiong et al., "Study on the Microstructure and Magnetic Properties of Rapidly Quenched $SM(Co_{1-x}Cu_x)_5$ Alloys," *Proc. 17th Int. Workshop on RE Magnets and Their Applications*, pp. 893-899, Aug. 2002.

Trammell, "Magnetic Ordering Properties of Rare-Earth Ions in Strong Cubic Crystal Fields," *Physical Review*, vol. 131, No. 3, pp. 932-948; Aug. 1, 1963.

Halbach, "Design of Permanent Multipole Magnets With Oriented Rare Earth Cobalt Material," *Nuclear Instruments and Methods*, vol. 169, pp. 1-10, 1980.

Japanese Office Action for corresponding Application No. 2004-013746 mailed Feb. 19, 2008.

Coey, "Topical Review Permanent Magnet Applications," *Journal of Magnetism and Magnetic Materials*, vol. 248, No. 3, pp. 441-456, Aug. 1, 2002.

EP Search Report for EP 05 25 0269 dated Nov. 19, 2009.

\* cited by examiner

ZX-PLANE

FIG.4

YZ-PLANE

PERMANENT MAGNET TYPE MAGNETIC FIELD GENERATING APPARATUS

BACKGROUND OF THE INVENTION

1. Field of the Invention

The present invention relates to permanent magnet type magnetic field generating apparatuses.

2. Description of Related Art

As will be explained in detail below, generally, a dipole ring magnetic field generating apparatus comprises a plurality of permanent magnets disposed in a ring shape such that the magnetization direction of the permanent magnet pieces undergoes one rotation over a half-circumference of the ring, and generates a substantially unidirectional magnetic field in a space within the ring, and have permanent magnet pieces whose magnetic strength is the same. Such dipole ring magnetic field generating apparatuses are utilized widely as uniform magnetic field generating means, for example, in magnetic resonance imaging (MRI) devices, semiconductor element manufacturing processes and in fundamental research. (See Halbach, K. Design of permanent magnet multipole magnets with oriented rare earth cobalt material, Nuclear instruments and Methods, vol. 169, 1980, pp 1-10, which is herein incorporated by reference.) Conventionally, magnets such as normal electromagnets and super-conducting electromagnets have been used as means for generating a magnetic field that is uniaxially uniform, however with recent developments of high performance rare earth permanent magnets, it has become commonplace to use rare earth permanent magnets (referred to below simply as "permanent magnets") as uniform magnetic field generating apparatuses for low magnetic fields, such as less than 1 T (Tesla: kg·s$^{-2}$·A$^{-1}$).

Figure 8:
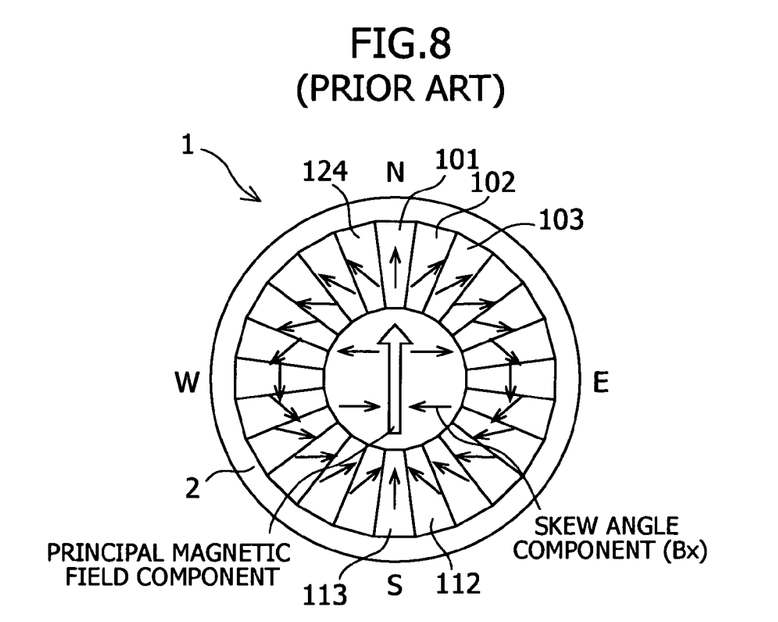
FIG. 8 is a schematic, cross-sectional view of a conventional dipole ring magnetic field generating apparatus on a plane perpendicular to its center axis.

Conventional dipole ring magnetic field generating apparatuses and the permanent magnet pieces used therein and others are described with reference to FIG. 8. FIG. 8 is a schematic, cross-sectional view of a conventional dipole ring magnetic field generating apparatus on a plane perpendicular to its center axis. As shown in the diagram, a dipole ring magnetic field generating apparatus 1 includes a plurality of permanent magnet pieces 101 to 124 disposed in a ring shape, and preferably is encompassed by a perimeter yoke 2 on its outer side.

The permanent magnet pieces 101 to 124 that form the constituent magnet of the dipole ring magnetic field generating apparatus have substantially the same magnetic strength, and the permanent magnet pieces are magnetized in a predetermined orientation with respect to the radial direction respectively, such that when the permanent magnet pieces are disposed in a ring shape, the magnetization direction of the permanent magnet pieces undergoes one rotation over a half-circumference of the ring. Thus, the permanent magnet pieces are magnetized so that permanent magnet pieces that are directly opposite when viewed from the center axis of the ring that constitutes the magnetic field generating apparatus (for example permanent magnet pieces 101 and 113) have a difference in magnetization direction of 180 degrees. More specifically, it is preferable that the permanent magnet pieces are magnetized at the angular shown in formulas (1) and (2) below. However, in accordance with such factors as conditions of use and optimization, it is also possible to arrange and adjust the magnetization direction within a range of, for example, ±about 5°.

$$\theta n = -\frac{360}{N}*n \quad (n = 1, 2, \ldots, N/2) \quad (1)$$

$$\theta n = 360\left(\frac{n}{N} - 1\right) \quad (n = N/2+1, N/2+2, \ldots, N) \quad (2)$$

N: number of divisions of the constituent magnet (natural number).

n: permanent magnet piece number (natural number).

θn: magnetizing direction of the nth permanent magnet piece.

By such a configuration, a magnetic field (main magnetic field component) that is substantially unidirectional, and that is of substantially uniform strength is generated in the space inside the ring of the dipole ring magnetic field generating apparatus 1. In the following, the Z-axis is defined as a center axis of the ring that constitutes the dipole ring magnetic field generating apparatus, the Y-axis (the NS magnetic field direction in FIG. 8) is defined as an axis that passes through the center of the ring and that is parallel to the unidirectional magnetic field and the X-axis (the EW magnetic field direction in FIG. 8) is defined as an axis that passes through the center of the ring and that is perpendicular to the Z-axis and the Y-axis. Here, the center of the ring that constitutes the magnetic field generating apparatus is on the center axis of the ring, and the mid point in the center axis direction.

As explained above, one of the characteristics of the dipole ring magnetic field generating apparatus is that the magnetic field of substantially a single direction can be formed in the inner space of the magnetic field generating apparatus. When the NS direction (the Y-axis direction) of the magnetic field generated in the inner space of the dipole ring magnetic field generating apparatus is 0°, the angle of the magnetic field vector at points in the inner space (referred to below as "skew angle") is substantially 0° in the vicinity of the center axis of the ring, but due to the properties of the magnetic field generating apparatus, it tends to deteriorate, namely become large, as it approaches the inside wall of the magnetic field generating apparatus.

During use of the ordinary ring magnetic field generating apparatuses, the magnetic field components in which this skew angle is large are generally seen as impurities, that is to say, as noise. Particularly the skew angle component in the XY-plane of the inner space of a magnetic field generating apparatus such as shown in FIG. 8 may have a large influence on the performance of elements manufactured in the manufacturing process of, for example, substrates for semiconductors, and there is a need to make the skew as small as possible.

Furthermore, as noted above, another characteristic of a dipole ring magnetic field generating apparatus is that the magnetic field of substantially uniform strength can be formed in the inner space of the magnetic field generating apparatus, that is to say that the uniformity of the magnetic field is favorable. These two characteristics, as well as the quality of the magnetic efficiency, are the biggest advantages of this magnetic field generating apparatus, and they are the reason for the wide industrial utilization of dipole ring magnetic field generating apparatuses. However, improving the skew angle and improving the uniformity of the magnetic field cannot always be achieved at the same time, but rather there is the risk that if one is optimized, characteristics of the other may be lost.

SUMMARY OF THE INVENTION

Consequently, it is an object of the present invention to achieve a magnetic field with high uniformity and low skew angle in a dipole ring magnetic field generating apparatus.

In one aspect of the present invention, there is provided a permanent magnet type magnetic field generating apparatus comprising: a plurality of permanent magnet pieces disposed in a ring shape so that a substantially unidirectional magnetic field is generated in a space within the ring, the permanent magnet pieces having the magnetization direction undergoing one rotation over a half-circumference of the ring, the permanent magnet pieces having substantially the same magnetic strength, and the permanent magnet pieces being disposed so as to form indentations and protrusions toward a center axis of the ring, or having a shape having indentations and protrusions facing the center axis. Preferably, when the Z-axis is defined as a center axis, the Y-axis is defined as an axis that passes through a center of the ring and that is parallel to the unidirectional magnetic field, and the X-axis is defined as an axis that passes through the center and that is perpendicular to the Z-axis and the Y-axis, the indentations and protrusions are symmetrical with respect to at least one of an XY-plane, a YZ-plane and a ZX-plane.

In addition, preferably, the permanent magnet type magnetic field generating apparatus according to the present invention, further comprises a magnetic field adjustment mechanism in an indentation of the indentations and protrusions. Preferably, the magnetic field adjustment mechanism is a ferromagnet or a magnet.

The inventors of the present invention, having an aim to optimize the arrangement of permanent magnet pieces in a dipole ring magnetic field generating apparatus, and preferably, by optimizing the radial thickness of the magnets such that there is mirror symmetry with respect to the reference planes: the XY-plane, the YZ-plane and the ZX-plane, and by disposing magnetic field adjustment mechanisms of a ferromagnet or a magnet, in space portions created by the optimization, discerned a high magnetic uniformity with low skew angle, and thus achieved the present invention.

As will be described in detail below, according to the present invention, particularly by optimizing the radial dimension of the permanent magnet pieces, and by providing a magnetic field adjustment mechanism that utilizes the gap created by the optimization, it is possible to simultaneously achieve a high magnetic field uniformity and low skew angle.

DETAILED DESCRIPTION OF PREFERRED EMBODIMENTS

Embodiments of the present invention are described below with reference to the attached drawings. The embodiments described below do not limit the present invention.

As described above, according to the present invention there is provided a permanent magnet type magnetic field generating apparatus comprising: a plurality of permanent magnet pieces disposed in a ring shape so that a substantially unidirectional magnetic field is generated in a space within the ring, the permanent magnet pieces having the magnetization direction undergoing one rotation over a half-circumference of the ring, the permanent magnet pieces having substantially the same magnetic strength, and the permanent magnet pieces being disposed so as to form indentations and protrusions toward a center axis of the ring, or having a shape having indentations and protrusions facing the center axis. The basic structure and principle of the present invention are in accordance with the conventional dipole ring magnetic field generating apparatus illustrated in FIG. 8.

That is to say, the magnetic field generating apparatus according to the present invention includes a plurality of permanent magnets disposed in a ring shape, and preferably is encompassed on its outer side by a ring-shaped perimeter yoke. For the permanent magnet, Nd—Fe—B-based, Sm—Co-based and Sm N—Fe-based rare earth permanent magnets can be usually used. Nonexclusively, it is preferable to use Nd—Fe—B-based permanent magnets that are relatively inexpensive and have a high energy product. Furthermore, generally, for a perimeter yoke, ring-shaped ferromagnetic material or nonmagnetic material is used, and there is slightly better increase in magnetic efficiency when a ferromagnetic material is used for the perimeter yoke than when a non-magnetic material is used. Furthermore, the shape of the permanent magnet pieces may be, but not limited to, substantially trapezoidal or substantially sectoral (herein, the shape having the cross-sectional shape enclosed by two co-axial circular arcs and two radii which pass through the endpoints of the arcs), for example. Furthermore, the number of partitions of the magnets that constitute the magnetic field generating apparatus can be, but not limited to, from 4 divisions to about 60 divisions. In particular, in view of magnetic efficiency and ease of circuit fabrication, it is preferable that the number of constituent magnets is set in a range of about 12 to 36 divisions.

Furthermore, as noted above, the permanent magnet pieces 101 to 124 that form the constituent magnet of the dipole ring magnetic field generating apparatus have substantially the same magnetic strength, and the permanent magnet pieces are magnetized in a predetermined orientation with respect to the radial direction respectively, such that when the permanent magnet pieces are disposed in a ring shape, the magnetization direction of the permanent magnet pieces undergoes one rotation over a half-circumference of the ring. More specifically, it is preferable that the permanent magnet pieces are magnetized at the angular shown in formula (1) and (2) above. By such a configuration, a magnetic field is generated that is substantially unidirectional in the inner space of the ring of the dipole ring magnetic field generating apparatus 1, and that is of substantially uniform strength.

The permanent magnet pieces that constitute the dipole ring magnetic field generating apparatus have conventionally been configured such that their distance to the center axis, that is to say, their height of the inner radial side is the same. The reason for this may be that, in the case of conventional dipole ring magnetic field generating apparatuses, it was exceedingly difficult to fabricate magnetic circuits in order to configure complex magnets, and consequently consideration could not be given to proper design of the shape, or because conventionally there were few industrial applications requiring highly uniform, low skew angle magnetic fields. On the other hand, the magnetic field generating apparatus according to the present invention has a shape in which the permanent magnet pieces are disposed so as to form indentations and protrusions facing in the direction of the center axis of the ring, or the permanent magnet pieces have a shape with indentations and protrusions facing in the direction of the center axis. By providing indentations on the radially inward side of the permanent magnet pieces of the magnetic field generating apparatus as above, it is possible to achieve high magnetic field uniformity and low skew angle. As noted above, although it has conventionally been desired to improve the skew angle and increase the magnetic field uniformity, they have not necessarily been achievable at the same time. However, the present inventors have found that by providing indentations on the radially inward side of the magnetic field generating apparatus, high magnetic field uniformity and low skew angle can be achieved at the same time, leading to completion of the present invention.

Although there is no particular limitation to this, by adjusting the distance of the permanent magnet pieces to the center axis, that is to say, by disposing the permanent magnet pieces such that the distance of some permanent magnet pieces to the center axis of the ring is further than the distance of other permanent magnet pieces to the center axis of the ring, indentations and protrusions can be formed facing the center axis of the ring. Moreover, by adjusting the length (height) of the permanent magnet pieces in the radial direction, and by disposing the permanent magnet pieces such that the distance from their radially outward side to the center axis of the ring is the same, it is possible to adjust the distance of the permanent magnet pieces and the center axis. In this case, design is facilitated, and the magnetic field generating apparatus can be manufactured by disposing the permanent magnet pieces along a ring-shaped perimeter yoke as in the conventional manner, thus facilitating manufacture. Herein, the distance of the permanent magnet pieces and the center axis can be a minimum distance between the center axis and the permanent magnet pieces.

Furthermore, in order to determine the distance of the permanent magnet pieces to the center axis, or the length of the permanent magnet pieces in the radial direction, nonexclusively, it is preferable to use non-linear programming such as the quasi Newton method or a search algorithm as the calculation method. More specifically, taking as variables the distances of the permanent magnet pieces to the center axis, or the length of the permanent magnet pieces in the radial direction, those variables can be determined such that the skew angle ($\tan^{-1}$ ($B_y/B_x$)) of the magnetic field generating apparatus becomes a local minimum. In this case, for example, if the constituent magnet is divided into 24, for example, then there are 24 variable. Here, $B_x$ and $B_y$ indicate the X-axis direction magnetic field component and the Y-axis direction magnetic field component of the magnetic field formed by the magnetic field generating apparatus. Optimizing the values by using these calculation methods is obvious to a person skilled in the art, and thus the description of these calculation methods remains brief.

Furthermore, by using permanent magnet pieces having indentations and protrusions facing the center axis, it is possible to provide indentations and protrusions on the radially inward side of the magnetic field generating apparatus. In this case also, the shape, arrangement and size of the indentations and protrusions can be determined by non-linear programming such as the quasi Newton method or search algorithms.

Thus, when the X-axis, Y-axis and Z-axis are defined as above, then it is preferable that the indentations and protrusions are symmetrical with respect to at least one of, and preferably all of the XY-plane, YZ-plane and ZX-plane. This is because the skew angle distribution, that is to say, the distribution of the magnetic field component in the direction of the X-axis, is mirror symmetric with respect to the reference planes described above.

Figure 1:
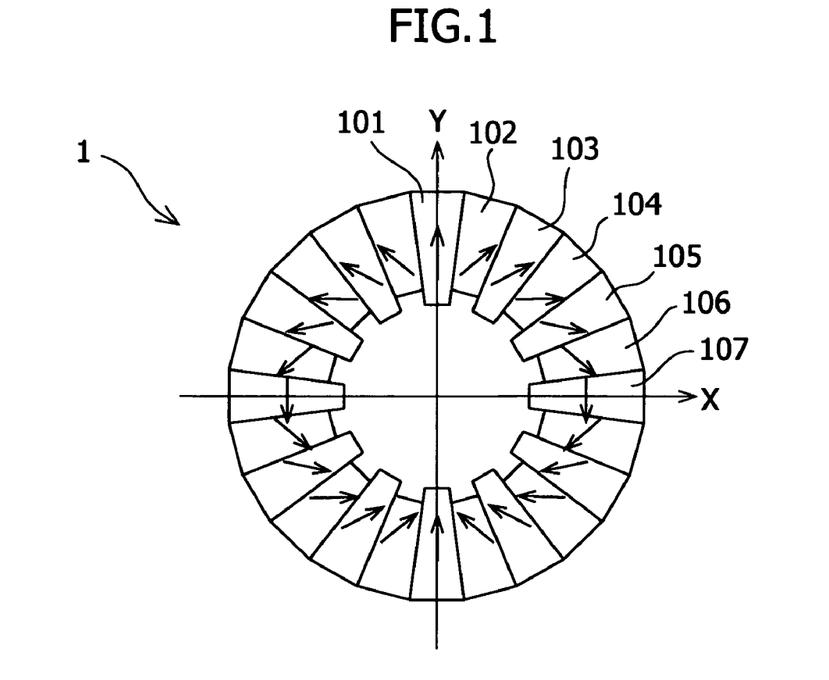
FIG. 1 is a schematic, cross-sectional view of a dipole ring magnetic field generating apparatus according to the first embodiment of the present invention taken along a plane perpendicular to the center axis.

A first embodiment of the present invention is described with reference to FIG. 1. FIG. 1 is a schematic, cross-sectional view of a dipole ring magnetic field generating apparatus according to the first embodiment of the present invention taken along a plane perpendicular to the center axis. The dipole ring magnetic field generating apparatus according to the present embodiment is constituted by 24 trapezoidal permanent magnet pieces. In the present magnetic field generating apparatus, the length of the permanent magnet pieces in the radial direction is adjusted such that they are symmetrical with respect to the YZ-plane and the ZX-plane, and the permanent magnet pieces are disposed such that the distance of the permanent magnet pieces to the center axis is symmetrical with respect to these planes. That is to say, indentations and protrusions are provided on the radially inward side of the permanent magnet pieces such that they are mirror symmetric with respect to the reference planes, the YZ-plane and the ZX-plane. It should be noted that although not shown in FIG. 1, these permanent magnet pieces may also be symmetrical with respect to the XY-plane.

Figure 2:
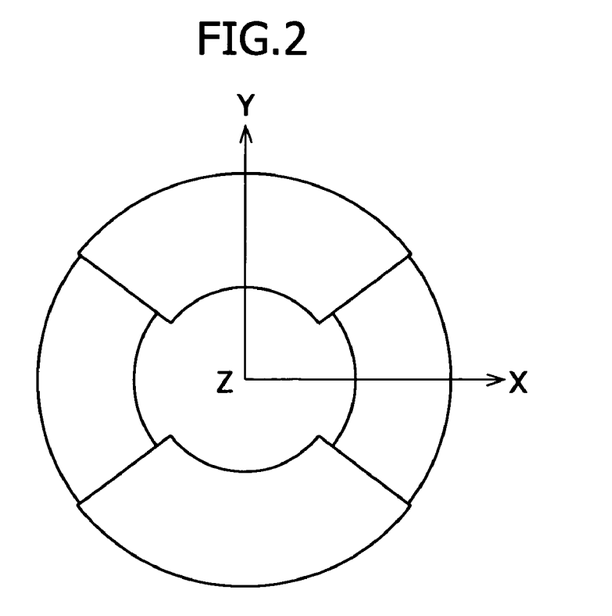
FIG. 2 is a schematic, cross-sectional view of a dipole ring magnetic field generating apparatus according to another embodiment of the present invention taking along a plane perpendicular to the center axis.

FIG. 2 is a schematic, cross-sectional view of a dipole ring magnetic field generating apparatus according to another embodiment of the present invention taking along a plane perpendicular to the center axis. The dipole ring magnetic field generating apparatus according to the present embodiment has four permanent magnet pieces, and is constituted by pieces that are substantially sectoral (herein the shape having the cross-sectional shape enclosed by two co-axial circular arcs and two radii which pass through the end points of the arcs). Indentations are provided on the radially inward side of the permanent magnet pieces such that they are mirror symmetric with respect to the reference planes, the YZ-plane and the ZX-plane.

Figure 3:
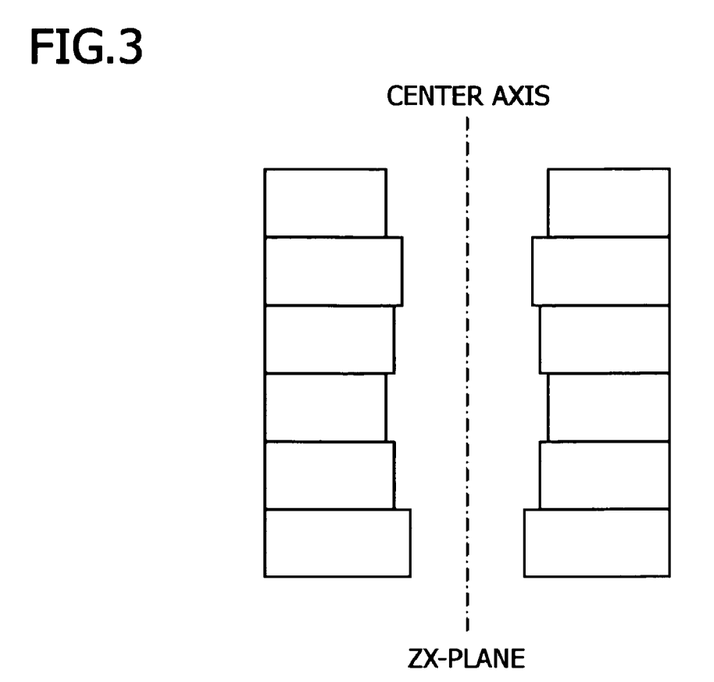
FIG. 3 is a schematic, cross-sectional view of a dipole ring magnetic field generating apparatus according to the present invention, taken along planes parallel to the center axis (ZX-plane).
Figure 4:
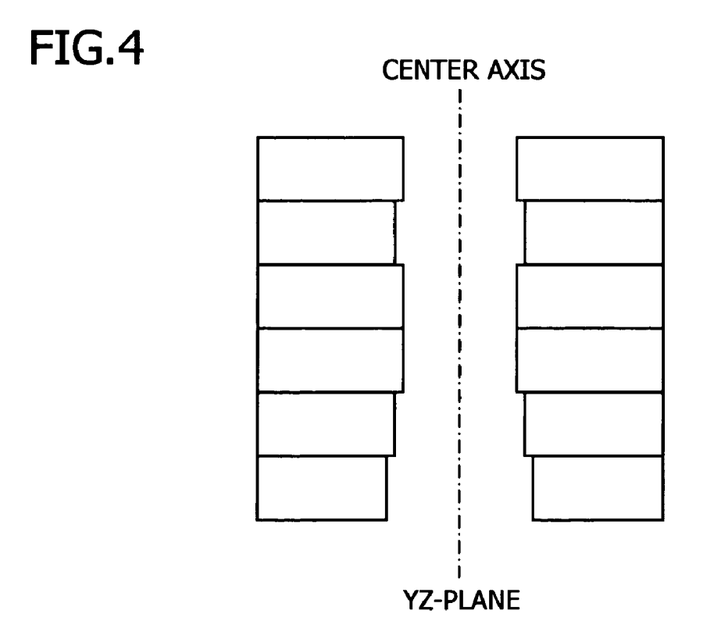
FIG. 4 is a schematic, cross-sectional view of a dipole ring magnetic field generating apparatus according to the present invention, taken along planes parallel to the center axis (YZ-plane).

Furthermore, FIG. 3 and FIG. 4 are schematic, cross-sectional views of a dipole ring magnetic field generating apparatus according to the present invention, taken along planes parallel to the center axis (ZX-plane and YZ-plane). As shown in FIG. 3 and FIG. 4, it is preferable that the permanent magnet pieces are arranged so as to be symmetrical with respect to the YZ-plane and the ZX-plane. It should be noted that as noted above, although it is possible to dispose the permanent magnet pieces such that they are also symmetrical with respect to the XY-plane, it is also possible to change the size of the gap portions by stepwise change of the length of the permanent magnet pieces. In this case, there is the following advantage. That is to say, because of the increase in the magnetic field uniformity in the uniform space of the magnetic circuit, it is possible to utilize the magnetic field more widely in the direction of the center axis. Consequently, optimization of the height of the magnets in the axial direction has the effect of increasing the usage efficiency of the magnetic circuit in industrial processes.

Thus, if the disposition and dimensions of the permanent magnet pieces are controlled (optimized) with the aim of reducing in particular the Bx component, then it is possible to dispose the permanent magnet pieces such that they are mirror symmetric with respect to the reference planes. Although of course it depends on the degree to which the Bx component is reduced, since the individual sizes of the permanent magnet pieces differ, the shape of the magnet arrangement obtained by this optimization is such that the shape is stepped.

Thus, by making the dipole ring of permanent magnet pieces having appropriate dimensions obtained by the above-noted optimization calculation, reduction of the skew angle, i.e. the Bx component, can be achieved. However, in the actual manufacture, because of the influence of factors such as the uneven distribution of the magnetic characteristics and dimensions of individual permanent magnet pieces, and the accumulation of errors that accompany the assembly of the magnetic field generating apparatus, the magnetic field uniformity and skew angle may be worse than could be expected from the optimization calculations.

It seems that these non-uniformities occur because the magnetic field uniformity and skew angle after completion is difficult to completely predict beforehand. It is therefore preferable to provide in advance a magnetic field adjustment mechanism (referred to below as "shim"). Particularly, it is preferable that the magnetic field generating apparatus according to the present invention further comprises the magnetic field adjustment mechanism on the indentations, that is to say, on the radially inward side of those permanent magnets whose distance to the center axis is far. That is to say, in the present invention, while low skew angle and high uniformity are achieved through the shape and arrangement of permanent magnet pieces obtained by optimization calculations, in order to handle non-uniform magnetic fields caused by errors in assembling the magnetic field generating apparatus, the magnetic field adjustment mechanism may be inserted, utilizing the radially inward space (the indentations) of the permanent magnet pieces created by arrangement of the permanent magnet pieces. Thus, it is particularly preferable that the magnetic field adjustment mechanism is provided on the indentations rather than on the radially inward protrusions of the permanent magnet pieces. This is because equipment such as vacuum chambers is often inserted in the inner space of the magnetic circuit, and in this case, in order to make effective use of the inner space, it is preferable that the inner portion has as few protruding portions as possible.

Nonexclusively, it is preferable that the magnetic field adjustment mechanism is a ferromagnet or magnet, and more specifically, provided that it is a material that is capable of altering the magnetic field of the space, any material may be used, such as ferromagnet like iron or nickel, for example, in addition to ferrite, or rare earth magnets and also sintered magnets or bonded magnets. Particularly, iron or sintered magnets such as rare earth magnets are preferred because they can generate a large change in the magnetic field in the space, and furthermore it is preferable that the maximum energy is at least 35 MG Oe (278 kJ/m$^3$). Furthermore, as a ferromagnet, use of a material whose saturation magnetization is at least 0.7 T is effective for magnetic field adjustment.

Figure 5:
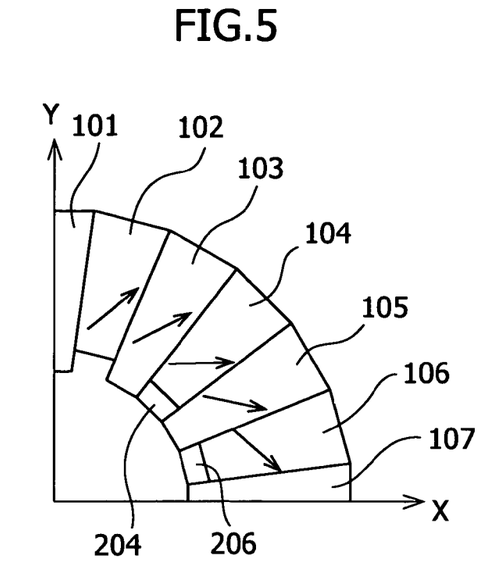
FIG. 5 is a schematic, cross-sectional view of a dipole ring magnetic field generating apparatus according to the present invention, provided with magnetic field adjustment mechanisms, taking along a plane perpendicular to the center axis.

FIG. 5 is a schematic, cross-sectional view of a dipole ring magnetic field generating apparatus according to the present invention, provided with magnetic field adjustment mechanisms 204 and 206, taking along a plane perpendicular to the center axis. Although the shape of the magnetic field adjustment mechanism may be any shape, it is preferable that it is matched to the shape of the permanent magnet and the indentation. That is to say, it can be provided with, but not limited to, a trapezoidal shape, for example, as shown in FIG. 5. Furthermore, since there is a risk of damaging the inner wall portion of the permanent magnet pieces, in certain cases it may also be effective to make adjustments such as molding the vicinity of the magnetic field adjustment mechanism with a non-magnetic body, for example, such as resins such as epoxy resin and polyvinyl chloride, and Al, to prevent damage when inserting the magnetic field adjustment mechanism.

It should be noted that the positions, number and the like of the magnetic field adjustment mechanisms are preferably analyzed by an optimization calculation. It is because that since the contribution of the magnetic field adjustment mechanism to a uniform space is very large even with a magnetic field adjustment mechanism in a single place or on a single side, it is laboring to improve the magnetic field by hand while carrying out measurements. Nonexclusively, a non-linear program such as the quasi Newton method or search algorithms can be used as the calculation method. By inserting a magnetic field adjustment mechanism whose position number and the like are determined in this manner, into the indentations on the inside of the permanent magnet piece, the magnetic field adjustment mechanism alters the magnetic field, and can further improve the magnetic field uniformity and skew angle of the magnetic field generating apparatus. Particularly, it is preferable that the position number and the like of the magnetic field adjustment mechanisms are symmetrical with respect to at least one of, and preferably all of the XY-plane, YZ-plane and ZX-plane, in a similar manner to the arrangement of the permanent magnet pieces in the foregoing description. This is because the skew angle distribution, that is, the distribution of the magnetic component in the direction of the X-axis, is mirror symmetric with respect to the reference planes described above. It should be noted that the magnetic field adjustment mechanism may be arranged after assembly of the permanent magnet pieces. Nonexclusively, methods such as fastening using adhesive, and mechanically fastening with bolts, for example, may be given as the method for installing the magnetic field adjustment mechanism.

Figure 6:
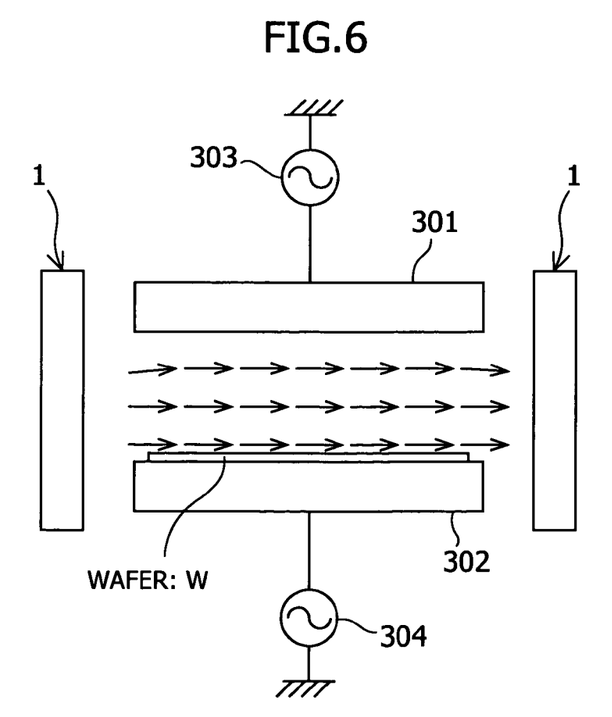
FIG. 6 is a schematic, cross-sectional view of a plasma processing device that utilizes the magnetic field generating apparatus according to the present invention, taking along a plane parallel to the center axis.

It should be noted that, as mentioned above, the magnetic field generating apparatus according to the present invention may be utilized as uniform magnetic field generating means in magnetic resonance imaging (MRI) devices, in semiconductor element manufacturing processes and in fundamental research. As an example, FIG. 6 is a schematic, cross-sectional view of a plasma processing device that utilizes the magnetic field generating apparatus according to the present invention, taking along a plane parallel to the center axis. Specifically, when the magnetic field generating apparatus according to the present invention is utilized in a plasma processing device, which is configured so as to perform a predetermined treatment on the surface of a substrate to be treated, such as a semiconductor wafer, it is possible to provide a processing chamber (not illustrated) in the space inside the ring of the constituent magnets of the magnetic field generating apparatus 1, and further provide the electrodes 301 and 302, and the power sources 303 and 304 for supplying electrical power at a predetermined frequency and voltage. Thus, as shown in FIG. 6, a substantially parallel magnetic field can be formed in the plane that includes a wafer W.

EXAMPLES

Embodiments of the present invention are described below with reference to the attached drawings. The embodiments described below do not limit the present invention.

Figure 7:
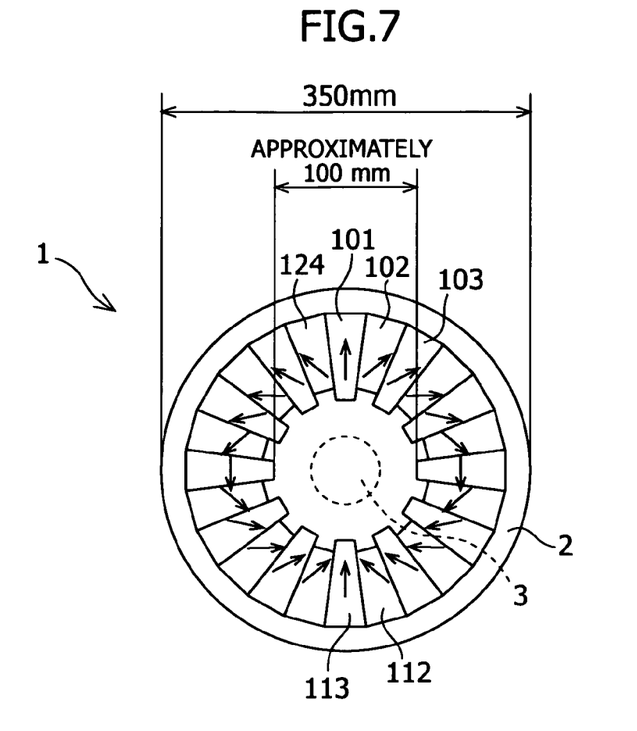
FIG. 7 is a schematic, cross-sectional view of a dipole ring magnetic field generating apparatus according to the present invention, taking along a plane perpendicular to the center axis.

FIG. 7 is a schematic, cross-sectional view of a dipole ring magnetic field generating apparatus according to the present invention, taking along a plane perpendicular to the center axis. The dipole ring magnetic field generating apparatus according to working example 1 is a dipole ring magnetic field generating apparatus of the shape shown schematically in FIG. 7, and the height of the permanent magnet pieces corresponding to the numbers shown in FIG. 1 are optimized as in Table 1, and it is fabricated based on the results of these calculations. Specifically, in the dipole ring magnetic field generating apparatus 1, 24 substantially trapezoidal permanent magnets 101 to 124 are disposed so as to form a ring shape, and these are encompassed by a perimeter yoke 2 on their outer side. Each permanent magnet piece 101 to 124 is magnetized in the direction given by the foregoing formulas (1) and (2). It should be noted that the outside diameter of the dipole ring magnetic field generating apparatus, including the perimeter yoke 2, is 350 mm, and the depth of the magnetic field generating apparatus is 300 mm. It should be noted that because the height in the radial direction of the permanent magnet pieces is as shown in Table 1, the internal diameter of the inner space is approximately 100 mm. Furthermore, a magnetic field evaluation space 3 has a cylindrical shape having a diameter of 50 mm and a depth of 100 mm, whose principal axis is the center axis of the ring, and the center of the ring and the center of the uniform space are the same. This is a regular design for a space when using a standard dipole ring magnetic field generating apparatus. It should be noted that the configured magnet was a neodymium-based rare earth sintered magnet (Grade N45M manufactured by Shin-Etsu Chemicals Co. Ltd., magnetic strength 1.35 T), and carbon steel was used for the perimeter yoke 2.

Moreover, a dipole ring magnetic field generating apparatus according to a working example 2 was provided by inserting magnetic field adjustment mechanisms (shim) to the dipole ring magnetic field generating apparatus according to working example 1. The shims were made of a ferromagnet (nickel plated carbon steel), and inserted into the inner concave portions of the magnets 2, 4 and 6. For the shims, a material coated in a PVC resin manufactured by Shin-Etsu Chemicals Co. Ltd. was used, for preventing damage to the interior surface of the permanent magnet pieces caused by insertion of the shims onto the indentations of the permanent magnet pieces. It should be noted that there is no particular limitation to the shape and dimensions of the shims, but because generally a very strong magnetic field is generated on the radially inward side of magnetic circuits, there are cases in which it is difficult to insert large magnets or ferromagnets such as iron, and at this time, adjustment was performed by inserting iron pieces approximately 20 mm square by 5 mm thick.

TABLE 1

| Magnet No. | Dimension in radial direction (mm) |
|---|---|
| 101 | 99 |
| 102 | 97 |
| 103 | 100 |
| 104 | 90 |
| 105 | 100 |
| 106 | 98 |
| 107 | 90 |

It should be noted that the shape of the optimized permanent magnet pieces, and the position and amount of the applied shim was symmetrical with respect to the XY-plane, the YZ-plane and the ZX-plane. Thus, the height of the permanent magnet pieces with magnet numbers 101 to 107 can be applied to the height of the permanent magnet pieces on the entire circumference of the dipole ring magnetic field generating apparatus. That is to say, by arranging the entire circumference of the magnetic field generating apparatus to be symmetric as if a mirror was placed on the X-axis and Y-axis shown in FIG. 5, it is possible to favorably improve the magnetic field uniformity and reduce the skew angle and the like of the entire inner region of the circuit Moreover, the dipole ring magnetic field generating apparatus according to a comparative example was provided by arranging a dipole ring magnetic field generating apparatus of working example 1 so as not to have indentations on the radially inward side of the magnets.

The results of the comparison of magnetic field uniformity and skew angle between the magnetic field generating apparatus of working example 1 (before magnetic field adjustment), working example 2 (after magnetic field adjustment) and comparative example 1, are shown in Table 2. Magnetic field uniformity and skew angle were determined as follows.

1) Degree of magnetic field uniformity=(maximum magnetic field−minimum magnetic field, within the uniform space)/value of the average magnetic field of the uniform space× 100 [%].
2) Skew angle=$\tan^{-1}$(magnetic field component by-product (X-axis direction)/main magnetic field component (Y-axis direction).

TABLE 2

| | Working example 1 | Working example 2 | Comparative example |
|---|---|---|---|
| Degree of magnetic field uniformity within the space [%] | 4.2 | 4.0 | 4.2 |
| Skew angle [deg] | 1.1 | 0.4 | 1.5 |

As above, in accordance with the present invention, by providing an indentation on the inside of the permanent magnet pieces, high magnetic field uniformity and low skew angle are achieved, and also, by a series of magnetic field adjustments using magnetic field adjustment mechanisms, the skew angle was improved to half that value or less, and the magnetic field uniformity was also further improved. Thus, according to the present invention, not only are there improvements to the magnetic field characteristics of the dipole ring magnetic field generating apparatus, whose magnetic field had been difficult to adjust, but by providing magnetic field adjustment mechanisms for further improving the characteristics, it is possible to achieve a magnetic field with a low skew angle and high uniformity.

The invention claimed is:

1. A permanent magnet type magnetic field generating apparatus comprising:
a plurality of permanent magnet pieces disposed in a ring shape so that a substantially unidirectional magnetic field is generated in a space within the ring,
the permanent magnet pieces having the magnetization direction undergoing one rotation over a half-circumference of the ring,
the permanent magnet pieces having substantially the same magnetic strength, and
the permanent magnet pieces each having an outer side defining an outer surface of the ring, and an opposite inner surface facing towards a center axis of the ring, wherein each of the outer sides of the permanent magnet pieces includes a pair of ends that are each in an abutting relation with the end of an outer side of an adjacent permanent magnet pieces such that the outer side of each permanent magnetic piece is coterminous with the outer side of an adjacent permanent magnetic piece, the permanent magnet pieces being disposed so as to form indentations and protrusions toward the center axis of the ring, or having a shape having indentations and protrusions facing the center axis,
wherein each of the permanent magnet pieces is unseparated as to a radial direction of the ring.

2. The permanent magnet type magnetic field generating apparatus according to claim 1, wherein when the taxis is defined as a center axis, the Y-axis is defined as an axis that passes through a center of the ring and that is parallel to the unidirectional magnetic field, and the X-axis is defined as an axis that passes through the center and that is perpendicular to the Z-axis and the Y-axis. the indentations and protrusions are symmetrical with respect to at least one of an XY-plane, a YZ-plane and a ZX-plane.

3. The permanent magnet type magnetic field generating apparatus according to claim 1, further comprising a magnetic field adjustment mechanism in an indentation of the indentations and protrusions.

4. The permanent magnet type magnetic field generating apparatus according to claim 3, wherein the magnetic field adjustment mechanism is a ferromagnet or a magnet.

5. The permanent magnet type magnetic field generating apparatus according to claim 2, further comprising a magnetic field adjustment mechanism in an indentation of the indentations and protrusions.

6. The permanent magnet type magnetic field generating apparatus according to claim 1, wherein at least one of the permanent magnet pieces has a different length as to the radial direction frown at least one of the other permanent magnet pieces.

7. The permanent magnet type magnetic field generating apparatus according to claim 1, wherein each permanent magnet piece includes a pair of opposing sides having a first end disposed toward the center axis of the ring and a second, opposite end disposed at the outer surface of the ring, and wherein a distance from the center axis of the ring to each of the second ends is the same for each of the permanent magnet pieces.

8. A permanent magnet type magnetic field generating apparatus comprising:
a plurality of permanent magnet pieces disposed in a ring shape so that a substantially unidirectional magnetic field is generated in a space within the ring,
the permanent magnet pieces having the magnetization direction undergoing one rotation over a half-circumference of the ring,
the permanent magnet pieces having substantially the same magnetic strength, and
the permanent magnet pieces each including an outer side that collectively define an outer surface of the ring, an opposite inner side facing towards a center axis of the ring, and opposite sides that each extend radially of the center axis of ring, each of said opposite sides including an end disposed at the outer side of the permanent magnetic pieces, wherein a distance from the center axis of the ring to said end of the opposite sides is the same for each of the permanent magnetic pieces the permanent magnet pieces being disposed so as to form indentations and protrusions toward a center axis of the ring, or having a shape having indentations and protrusions facing the center axis, and
wherein each of the permanent magnet pieces has a unitary structure in a radial direction of the ring.

9. The permanent magnet type magnetic field generating apparatus according to claim 8, wherein when the Z-axis is defined as a center axis, the Y-axis is defined as an axis that passes through a center of the ring and that is parallel to the unidirectional magnetic field, and the X-axis is defined as an axis that passes trough the center and that is perpendicular to the Z-axis and the Y-axis, the indentations and protrusions are symmetrical with respect to at least one of an XY-plane, a YZ-plane and a ZX-plane.

10. The permanent magnet type magnetic field generating apparatus according to claim 8, further comprising a magnetic field adjustment mechanism in an indentation of the indentations and protrusions.

11. The permanent magnet type magnetic field generating apparatus according to claim 8, wherein the magnetic field adjustment mechanism is a ferromagnet or a magnet.

12. The permanent magnet type magnetic field generating apparatus according to claim 9, further comprising a magnetic field adjustment mechanism in an indentation of the indentations and protrusions.

13. The permanent magnet type magnetic field generating apparatus according to claim 8, wherein the indentations and protrusions comprise a plurality of permanent magnet pieces of differing lengths in the radial direction of the ring, and wherein the permanent magnet pieces forming the protrusions have a longer length than the permanent magnet pieces forming the indentations.

14. The permanent magnet type magnetic field generating apparatus according to claim 13, wherein the permanent magnet pieces forming the protrusions and the permanent magnet pieces forming the indentations are arranged in an alternating pattern about the ring.

15. A permanent magnet type magnetic field generating apparatus comprising:
a plurality of permanent magnet pieces disposed in a ring shape so that a substantially unidirectional magnetic field is generated in a space within the ring, the plurality of permanent magnet pieces collectively defining an inner peripheral surface of the ring facing in the direction of a center axis of the ring, and an outer peripheral surface of the ring facing away from the center axis of the ring,
the permanent magnet pieces having the magnetization direction undergoing one rotation over a half-circumference of the ring,
the permanent magnet pieces having substantially the same magnetic strength, and
the permanent magnet pieces each having an outer side that collectively define the outer peripheral surface of the ring, and wherein each outer side is coterminous with the outer sides of adjacent permanent magnet pieces, the permanent magnetic pieces being disposed so as to form indentations and protrusions on the inner peripheral surface of the ring, and wherein each of the permanent magnet pieces is unseparated as to a radial direction of the ring.

16. The apparatus of claim 15, wherein the permanent magnet pieces are arranged to define an individual ring structure and said indentations and protrusions are disposed on said individual ring.

* * * * *

UNITED STATES PATENT AND TRADEMARK OFFICE
CERTIFICATE OF CORRECTION

PATENT NO. : 7,760,059 B2
APPLICATION NO. : 11/038857
DATED : July 20, 2010
INVENTOR(S) : Higuchi Page 1 of 1

It is certified that error appears in the above-identified patent and that said Letters Patent is hereby corrected as shown below:

Column 11,

Line 28, "taxis" should read --Z-axis--;

Line 50, "frown" should read --from--.

Column 12,

Line 23, "trough" should read --through--.

Signed and Sealed this
Twenty-first Day of June, 2011

David J. Kappos
*Director of the United States Patent and Trademark Office*